United States Patent [19]

Schotz

[11] Patent Number: 4,984,296
[45] Date of Patent: Jan. 8, 1991

[54] TUNED RADIO APPARATUS

[76] Inventor: Larry Schotz, 425 Green Bay Rd., Cedarburg, Wis. 53012

[21] Appl. No.: 155,151

[22] Filed: Feb. 11, 1988

[51] Int. Cl.⁵ .............................................. H04B 1/18
[52] U.S. Cl. ................................... 455/193; 455/195; 455/273; 343/715
[58] Field of Search ............... 455/293, 280, 291, 193, 455/195, 199, 297, 278, 274, 345, 272, 277, 273, 191; 343/711, 715, 714

[56] References Cited

U.S. PATENT DOCUMENTS

| | | | |
|---|---|---|---|
| 3,243,708 | 3/1966 | Manson | 455/293 |
| 4,381,566 | 4/1983 | Kane | 455/193 |
| 4,525,869 | 6/1985 | Hamada et al. | 455/277 |
| 4,667,342 | 5/1987 | Lindenmeier et al. | 455/293 |
| 4,675,687 | 6/1987 | Elliot | 343/715 |
| 4,739,516 | 4/1988 | Starkloff | 455/280 |

Primary Examiner—Curtis A. Kuntz
Attorney, Agent, or Firm—Curtis, Morris & Safford

[57] ABSTRACT

A tuned radio apparatus includes a tuned radio receiver and a tuned antenna apparatus both of which are tuned to the same frequency. The antenna apparatus may include a varactor similar to a varactor used in the receiver and receiving the same tuning voltage for tuning at least one antenna. The tuning voltage may be supplied from the receiver to the antenna apparatus and the received radio frequency output may be supplied from the antenna apparatus to the receiver over an antenna cable connected to a single antenna terminal.

18 Claims, 2 Drawing Sheets

TUNED RADIO APPARATUS

FIELD OF THE INVENTION

The present invention relates to a tuned radio apparatus and more particularly relates to a tuned radio receiver and antenna apparatus having improved selectivity.

BACKGROUND OF THE INVENTION

A great deal of emphasis has been placed on the design and development of automobile radios and/or stereo systems. Most of this development has related to the radio receiver proper, for example in the area of electronic tuning in which a microprocessor may electronically generate a tuning voltage which is then applied to a varactor to tune the receiver to a selected frequency. However, very little thought has been given to the design and development of the antenna which receives the broadcast signal and supplies it to the receiver. Indeed, current antennas used for automobiles have a broadband characteristic and offer no rejection of undesired signals. The presence of unwanted frequencies received by the antenna and supplied to the receiver may cause both overload and intermodulation at the front end.

OBJECTS AND SUMMARY OF THE INVENTION

Accordingly, it is an object of the present invention to provide a radio apparatus which avoids the above-described difficulties of the prior art.

It is another object of the present invention to provide an antenna apparatus which is itself tunable to a selected radio frequency.

It is yet another object of the present invention to provide a tuned antenna apparatus which has a narrow-band receiving characteristic and rejects signals having undesired frequencies.

It is a further object of the present invention to provide a tuned antenna capable of resonating at a desired frequency and rejecting all other unwanted frequencies before they are coupled to the receiver.

It is yet a further object of the present invention to provide a tuned radio receiver incorporated with a tuned antenna whereby a tuning voltage from the receiver may be used to tune the antenna.

It is still a further object of the present invention to provide such a tuned radio apparatus in which the tuning voltage is easily and simply supplied from the receiver to the antenna.

In accordance with an aspect of the present invention, then, a tuned antenna apparatus for use in a radio wave system including a tuned radio receiver comprises a source of tuning voltage adapted for supply to a tuned receiver and indicative of a selected radio frequency, resonator means tunable to resonate at the selected radio frequency for receiving a broadcast radio signal at its resonating frequency, and control means responsive to the tuning voltage for tuning the resonator means to the selected radio frequency.

In accordance with another aspect of the present invention, a tuned radio apparatus comprises receiver means for producing an information signal in response to a desired radio frequency signal having a respective selected frequency, the receiver means including tuning voltage generating means for generating a tuning voltage indicative of the selected frequency and selecting means for selecting the desired radio frequency signal from signals supplied thereto in response to the tuning voltage, and antenna means tunable in response to the tuning voltage to resonate at the selected frequency for receiving a broadcast radio frequency signal having the selected frequency and for supplying the same to the receiver means.

In a further development in accordance with this aspect of the present invention, the antenna means of such a tuned radio apparatus includes an antenna terminal to which the received broadcast radio frequency signal is supplied, the antenna terminal further connected to the tuning voltage generating means to receive the tuning voltage, at least one resonating antenna tunable to the selected frequency, filter means connected to the antenna terminal for outputting the tuning voltage and control means connected to receive the tuning voltage from the filter means for tuning the antenna to the selected frequency.

In accordance with yet another aspect of the present invention, a method of receiving a broadcast signal having a selected frequency comprises the steps of generating a tuning voltage indicative of a selected radio frequency, tuning a tunable antenna apparatus to resonate at the selected radio frequency in accordance with the tuning voltage, tuning a tunable receiver apparatus to the selected radio frequency in accordance with the tuning voltage and supplying a received broadcast signal from the antenna apparatus to the receiver apparatus.

In the foregoing summary and following description, the term "radio" is intended to refer to the electromagnetic wave radiation reception of information, such as broadcast radio program (AM and FM), television programs and other information (e.g. telemetry, telephone, data, etc.) communicated by such electromagnetic wave radiation to an antenna.

These and other objects, features and advantages of the present invention will become apparent from the following detailed description of a preferred embodiment illustrated in the accompanying drawings throughout which like reference numerals denote like elements and parts.

BRIEF DESCRIPTION OF THE DRAWINGS

FIG. 3 is a schematic drawing of a tuned antenna apparatus of the preferred embodiment of FIG. 1.

DETAILED DESCRIPTION OF THE PREFERRED EMBODIMENT

Figure 1:
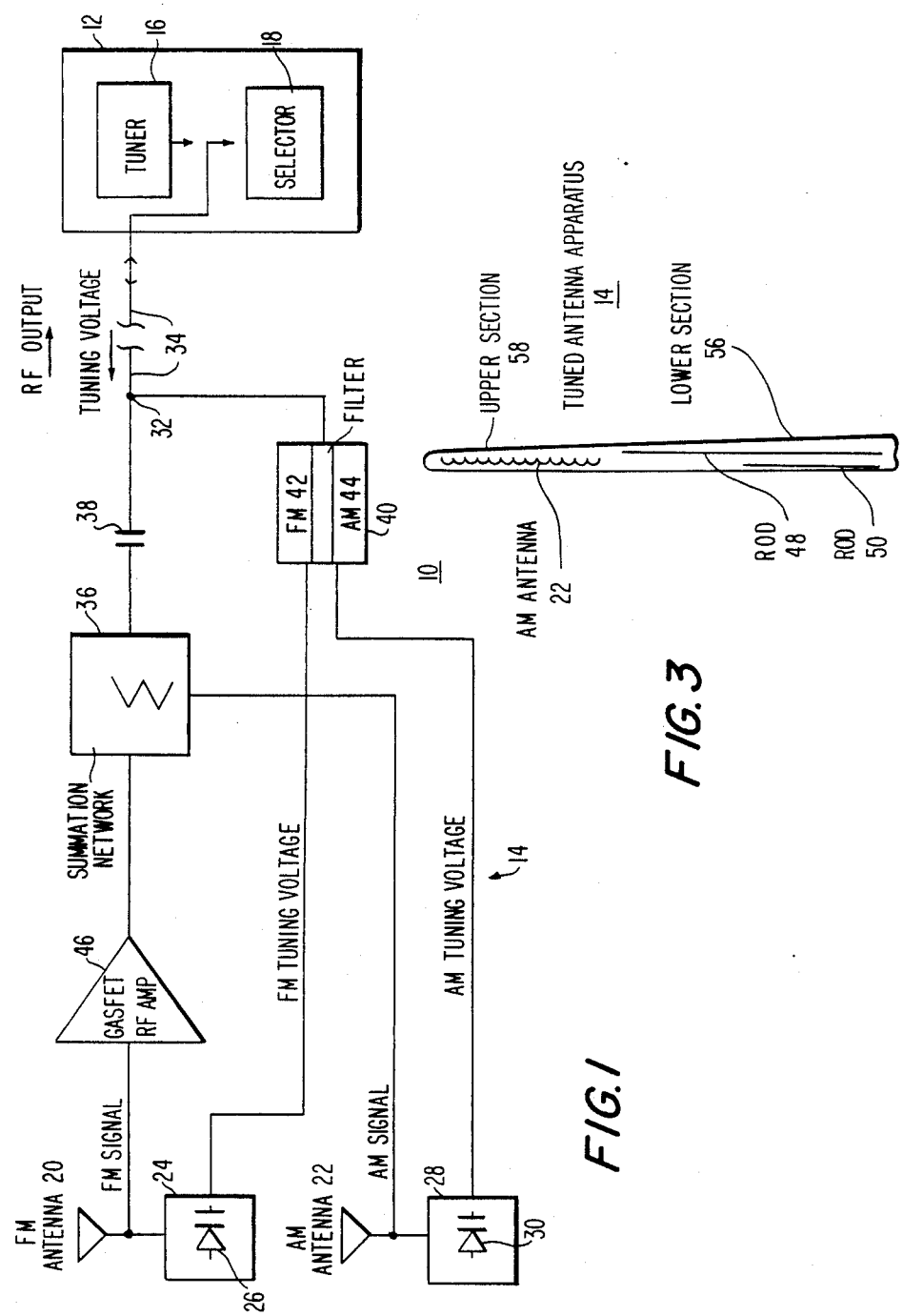
FIG. 1 is a block diagram of the preferred embodiment of the tuned radio apparatus according to the present invention.

Referring now to the drawings and initially to FIG. 1 thereof, the tuned radio apparatus 10 according to the present invention includes a tuned radio receiver 12 and a tuned antenna apparatus 14. As is well known in the art, radio receiver 12 is that part of a radio communication system which abstracts the desired information from the radio frequency energy collected by antenna apparatus 14. Radio receiver 12 performs the three basic functions of selection, amplification and detection. In particular, receiver 12 includes a tuning circuit or tuning voltage generator 16 for generating a tuning voltage indicative of a selected frequency, that is, the particular frequency of the broadcast signal which it is desired to receive. The selected frequency, and its respective tuning voltage, may of course be varied to sweep the entire range of frequencies which receiver 12 is adapted to receive, for example, the conventional AM and FM band radio frequencies. Receiver 12 further contains a selecting circuit 18 which is responsive to the tuning voltage to select from signals supplied thereto the desired signal having the selected frequency. Advantageously, tuning voltage generator 16 is an electronic tuner including a microprocessor for electronically generating the tuning voltage and selecting circuit 18 includes a varactor, generally a varactor diode, which is tuned by the tuning voltage to select the desired signal. Such tuned radio receivers are of course well known in the art, and significant design and development efforts have been directed towards increasing the selectivity of such tuned radio receivers. However, such tuned radio receivers have conventionally been used with an untuned antenna which has a broadband characteristic and offers no rejection of undesired signals. Therefore, the broadcast RF signals received by a conventional antenna contain components at all the carrier frequencies of the various signals broadcast in that area, and so the selectivity of the entire radio apparatus depends entirely on the selectivity of the receiver itself. In some radio receivers this has led to problems in overload and intermodulation at the front end.

The present invention is a departure from these conventional systems and includes both tuned radio receiver 12 and tuned antenna apparatus 14. Both components assist in the selectivity of the radio apparatus as a whole in rejecting broadcast signals at unwanted frequencies. Indeed, radio apparatus 10 according to the present invention rejects such unwanted frequencies before they are coupled to receiver 12, so that the selectivity and performance of radio apparatus 10 can be significantly better than conventional radio systems.

In the example shown in FIG. 1, tuned antenna apparatus 14 includes an FM antenna 20 which is tunable to receive a broadcast RF signal at a selected FM frequency and to supply the received FM signal to receiver 12. Tuned antenna apparatus 14 also includes a tunable AM antenna 22, which is similarly tunable to receive a broadcast RF signal at a selected AM frequency and to supply the received AM signal to receiver 12. While tuned antenna apparatus 14 is illustrated in the preferred embodiment as including both FM antenna 20 and AM antenna 22, it will be understood from the following description that each antenna operates independently and that an antenna apparatus 14 including only an FM antenna 20 or an AM antenna 22 would also be within the scope of the present invention.

FM antenna 20 is tuned in response to a tuning signal supplied from a control circuit 24, which advantageously includes a varactor 26 of the same type as the FM band varactor within selecting circuit 18 in receiver 12. As a result, the same FM tuning voltage which tuning voltage generator 16 supplies to the varactor in selecting circuit 18 may also be supplied to varactor 26 in control circuit 24 to vary the capacitance of varactor 26 and thereby vary the resonant frequency of FM antenna 20. FM antenna 20 and varactor 26 may be thought of as a resonator and are thereby tuned to resonate and receive a broadcast signal at the selected frequency and further supply the received FM signal to receiver 12. The specific tuning voltage is, as is conventional, indicative of the selected frequency of the particular broadcast signal which is to be received. The use of the same tuning voltage to control both the FM varactor in selecting circuit 18 of receiver 12 and varactor 26 in control circuit 24 for controlling FM antenna 20 is advantageous in insuring that both FM antenna 20 and receiver 12 will be tuned to the same selected frequency. Thus, when the operator of radio apparatus 10 wishes to change the selected frequency, for example in fine tuning or to change stations, the conventional FM controls of a conventional receiver may be used without modification to tune both receiver 12 and FM antenna 20.

Correspondingly, a second control circuit 28 includes a varactor 30 here again a varactor diode, which varies the capacitance connected to AM antenna 22 to tune it to resonate at the selected frequency in response to the tuning voltage from tuning voltage generator 16 within receiver 12 and advantageously is of the same type as the AM band varactor within selecting circuit 18 of receiver 12. AM antenna 22 and varactor 30 may be thought of as a resonator and are thereby tuned to resonate and receive a broadcast signal at the selected frequency and further supply the received AM signal to receiver 12. As with FM antenna 20, since both the AM varactor in selecting circuit 18 and varactor 30 in control circuit 28 advantageously in the preferred embodiment receive the same tuning voltage, both receiver 12 and AM antenna 22 will surely be tuned to the same selected frequency, and the conventional AM controls of a conventional receiver may be used without modification to tune both receiver 12 and AM antenna 22.

In accordance with an advantageous aspect of the present invention, the tuning voltage from tuning voltage generator 16 is supplied to control circuits 24 and 28 and the received FM or AM RF output is supplied to receiver 12 through the same antenna terminal 32. Both the input tuning voltage and the RF output are transmitted between antenna terminal 32 and radio receiver 12 over the conventional antenna cable 34, so that a separate connection for the tuning voltage is unnecessary. In order to achieve this result, the only modification necessary to a receiver 12 having an electronic tuner is to decouple or tap the tuning voltage from tuning voltage generator 16 and to apply the same to antenna cable 34 of receiver 12.

Figure 2:
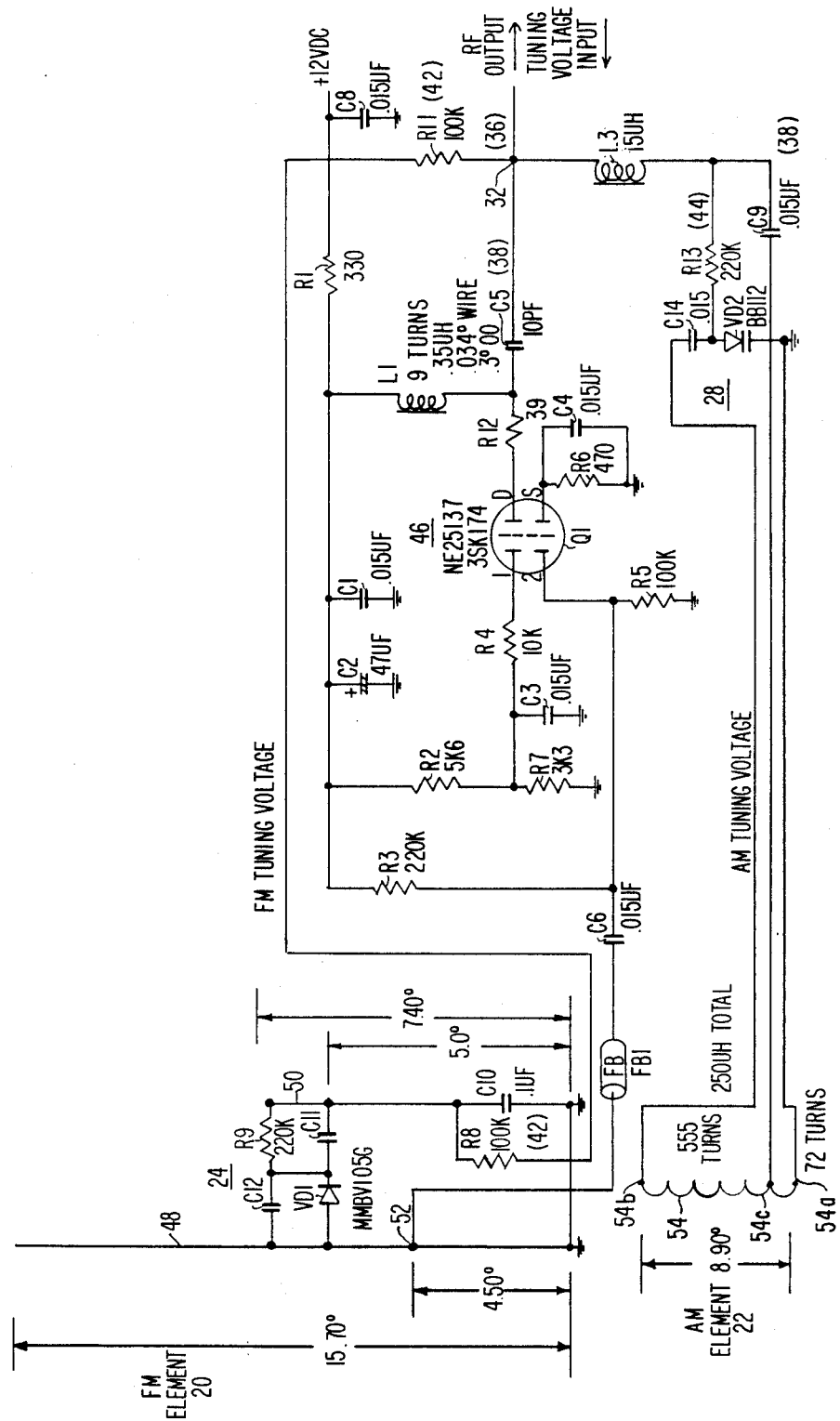
FIG. 2 is a schematic diagram of the preferred embodiment of FIG. 1.

The outputs of FM antenna 20 and AM antenna 22 are therefore advantageously summed for transmission over antenna cable 34. To this end, as shown in FIG. 1, a summation network 36 may be provided which sums the received signals and supplies the summed signal to antenna terminal 32. Alternatively, as shown in FIG. 2 discussed below, antenna terminal 32 itself may define the summation point for the two signals. It will of course be understood that for a particular tuning voltage only a single frequency within the AM or FM band will be selected, so that generally only one of FM antenna 20 and AM antenna 22 will be supplying a signal to summation network 36. A capacitor 38 is connected between summation network 36 and antenna terminal 32 to block a DC component, which may include a tuning voltage component. Therefore, a substantially pure RF output is supplied to receiver 12. Correspondingly, in order to insure that the signal supplied to varactors 26 and 30 within control circuits 24 and 28, respectively, includes the tuning voltage without interfering RF components output from summation network 36 through capacitor 38 to antenna terminal 32, a filter 40 is provided between antenna terminal 32 and control circuits 24 and 28. Advantageously filter 40 includes a FM filter circuit 42 particularly adapted to pass a tuning voltage indicative of a FM frequency to varactor 26 and an AM filter circuit 44 particularly adapted to pass a tuning voltage indicative to an AM frequency to varactor 30.

A preamplifier 46 is connected at the base of FM antenna 20 and before summation network 36 so as to amplify the FM band signal. By placing preamplifier 46 at the base of FM antenna 20, there will be no amplification of noise that may be introduced by antenna cable 34 and the signal will be amplified before any signal loss in cable 34 occurs. Advantageously, preamplifier 46 includes a gallium arsenide field effect transistor (GASFET) RF amplifier, which has superior overload characteristics and a very low noise figure.

Turning now to FIG. 2, which is a schematic of tuned antenna apparatus 14 of FIG. 1 in slightly modified form, it will be seen that FM antenna 20 is constructed as a tuned FM element including two parallel, grounded metal rods 48, 50. FIG. 2 includes the specifications for the components in a particularly advantageous embodiment of the present invention, and it will be apparent that other choices for the components and their values may be made within the scope of the present invention. First rod 48 is advantageously 15.70" long and connected directly to ground, while second rod 50 is advantageously 7.40" long and is isolated from ground by blocking capacitor C10, having a value of 0.1 F. The tuning voltage is applied from antenna terminal 32 through FM filter circuit 42 including resistors R11 (100 K) and R8 (100 K) to second rod 50 at a point above capacitor C10. Control circuit 24 includes varactor diode VD1 (MMBV105G), corresponding to varactor 26 in FIG. 1, connected between first and second rods 48, 50 above capacitor C10 and the connection supplying the tuning voltage. Control circuit 24 also includes capacitors C11 and C12 and resistor R9 (220 K). The tuning voltage applied by resistor R8 varies the capacitance of varactor diode VD1, whereupon second rod 50 is tunable in response to the tuning voltage and capacitor C10 blocks the zero DC voltage of ground from pulling down the tuning voltage.

The received FM signal is taken from FM antenna 20 at a tap 52 on first rod 48 and is supplied through ferrite bead FB1 to preamplifier 46 which includes GASFET Q1, from which the amplified output is supplied to antenna terminal 32 through capacitor C5 (10PF). GASFET Q1 is advantageously a NE25137-3SK174 FET in the preferred embodiment. Capacitor C5 shields GASFET Q1 from the DC tuning voltage at antenna terminal 32, and tap 52 is at a distance 4.50" from ground so as to match impedance with GASFET Q1.

Correspondingly, AM antenna 22 includes a tuned coil 54, such as an air coil which advantageously is 8.90" in height and has a total value of 250 uH. Coil 54 includes first and second end terminals 54a and 54b and a tap terminal 54c. The tuning voltage is supplied through inductor L3 (15 uH) and AM filter 44 including resistor R13 (220 K) to control circuit 28 including capacitor C14 (0.015 uF) and varactor diode VD2 (BB112), corresponding to varactor 30 in FIG. 1. Inductor L3 appears as an open circuit to signals at FM frequencies while allowing signals at AM frequencies and DC to pass. Series capacitor C14 is a tuning capacitor to tune varactor diode VD2 to AM frequencies and to block DC. The capacitance of varactor diode VD2 produced in response to the tuning voltage, together with the capacitance of capacitor C14, is thereupon supplied to first and second end terminals 54a, 54b of coil 54 to cause it to resonate at the selected AM frequency. The received broadcast AM signal is supplied from tap terminal 54c through capacitor C9 (0.015 uF) and inductor L3 to antenna terminal 32. As noted above, inductor L3 will pass AM band frequency signals. Capacitor C9 blocks the DC tuning voltage, corresponding to the function of capacitor C5 in the FM circuit. It will be noted that in the preferred embodiment as illustrated in FIG. 2, a separate summation network 36 and blocking capacitor 38 are not provided as in FIG. 1, but rather the function of capacitor 38 is performed by capacitors C9 and C5 before the summation of the two signals at antenna terminal 32. It will be understood that these arrangements of the preferred embodiment of FIGS. 1 and 2 are functionally equivalent.

The remaining resistive elements illustrated in FIG. 2 serve generally to bias GASFET Q1, while the remaining capacitative and inductive elements serve generally as bypass elements for AC and DC, respectively.

When tuned radio apparatus 10 is incorporated, for example, in a car stereo system, FM antenna 20 and AM antenna 22 may advantageously be combined in a unified structure which outwardly appears as a conventional car whip antenna, as shown in FIG. 3. In this unified structure, FM antenna 20 may advantageously constitute a lower section 56 of the structure while AM antenna 22 may advantageously constitute an upper section 58. Rods 48, 50 of FM antenna 20 are mounted closely adjacent each other within an outer plastic sheath. While they must be close enough to function effectively, the spacing is not critical and in the preferred embodiment is about ⅛ th inch.

In accordance with the present invention, an improved tuned radio apparatus includes a tuned radio receiver and a tuned antenna apparatus, each of which is tuned to receive the same selected frequency and to reject frequencies of unwanted signals. This improves the selectivity of the radio apparatus as a whole and reduces the problems of overload and intermodulation.

Although the present invention has been described in connection with a single preferred embodiment, it will be apparent to those skilled in the art that many modifications and changes may be made in the preferred embodiment without departing from the spirit or scope of the present invention. For example, while the tuned radio apparatus has been described as advantageous in connection with a car stereo system, it will be apparent that the present invention may be applied advantageously to other environments, such as cellular telephones. Also by way of example, while the tuned antenna system has been described in connection with an essentially conventional radio receiver having an electronic tuner and modified only to decouple the tuning voltage therefrom for application to the antenna cable, it will be apparent that the tuned radio receiver itself may be modified in other ways so long as the control circuit for the antenna apparatus is tuned to resonate at the selected frequency. These possible modifications are given by way of example only and other modifications and changes may be effected by one skilled in the art without departing from the scope and spirit of the invention as defined in the appended claims.

I claim:

1. Tuned radio apparatus, comprising:

receiver means for producing an output signal in response to selection command for a desired radio frequency signal having a respective selected frequency, said receiver means including tuning voltage generating means for generating a tuning voltage indicative of said selected frequency and selecting means for selecting said desired radio frequency signal from signals supplied thereto in response to said tuning voltage; and antenna means tunable in response to said tuning voltage to resonate at said selected frequency for receiving a radio frequency signal having said selected frequency and for supplying the same to said receiver means, said antenna means including an antenna terminal to which the received radio frequency signal is supplied, said antenna terminal further connected to said tuning voltage generating means of said receiver means to receive said tuning voltage, at least one resonating antenna tunable to said selected frequency, filter means connected to said antenna terminal for outputting said tuning voltage and control means connected to receive said tuning voltage from said filter means for tuning said antenna to said selected frequency.

2. Tuned radio apparatus according to claim 1, wherein said antenna means includes varactor means response to said tuning voltage for adjusting the frequency at which said antenna resonates.

3. Tuned radio apparatus according to claim 1, wherein said antenna means includes an FM antenna tunable to a selected FM frequency, an AM antenna tunable to a selected AM frequency and summation means connected to said FM antenna and said AM antenna to receive respective output signals therefrom for providing a summed output signal to said antenna terminal.

4. Tuned radio apparatus according to claim 3, further comprising gallium arsenide transistor preamplifier means connected between said FM antenna and said summation means for amplifying the output signal from said FM antenna.

5. Tuned radio apparatus according to claim 1, wherein said antenna means includes an FM antenna tunable to a selected FM frequency, an AM antenna tunable to a selected AM frequency, first and second varactor diode circuits for tuning said FM antenna and said AM antenna, respectively, and said filter means includes a FM filter circuit connected between said antenna terminal and said first varactor diode circuit and an AM filter circuit connected between said antenna terminal and said second varactor diode circuit.

6. Tuned radio apparatus according to claim 1, wherein said antenna terminal is connected to said tuning voltage generating means by an antenna cable.

7. Tuned radio apparatus, comprising:
receiver means for producing an output signal in response to a selection command for a desired radio frequency signal having a respective selected frequency, said receiving means including tuning voltage generating means for generating a tuning voltage indicative of said selected frequency and selecting means for selecting said desired radio frequency signal from signals supplied thereto in response to said tuning voltage;

resonating antenna element tunable to said selected frequency for receiving a radio frequency signal having said selected frequency and for supplying the same to said receiving means; and varactor means response to said tuning voltage for tuning said resonating antenna element to said selected frequency.

8. Tuned radio apparatus according to claim 7, which comprises more than one resonating antenna element.

9. Tuned radio apparatus according to claim 8, in which the resonating antenna elements include an FM antenna tunable to a selected FM frequency and an AM antenna tunable to a selected AM frequency and said varactor means includes first and second varactor diode circuits for tuning said FM antenna and said AM antenna, respectively.

10. Tuned radio apparatus according to claim 9, wherein said FM antenna and said AM antenna are included in a unitary antenna structure, said FM antenna constituting a lower section of said structure and said AM antenna constituting an upper section of said structure.

11. Tuned radio apparatus according to claim 7, wherein said resonating antenna means element includes a tuned FM antenna having first and second grounded parallel rods for resonating at FM frequencies and a varactor diode circuit connected between said first and second rods, said tuning voltage being supplied to a tunable one of said rods.

12. Tuned radio apparatus according to claim 7, wherein said resonating antenna element includes an AM antenna having a tuned coil with first and second terminals, and a varactor diode circuit connected between first and second terminals of said coil and supplied with said tuning voltage.

13. Tuned radio apparatus according to claim 7, wherein said tuned radio apparatus is incorporated in a car radio system.

14. Tuned antenna apparatus, for use in a radio apparatus including a tuned receiver, comprising:
a source of tuning voltage adapted for supply to a tuned receiver and indicative of a selected radio frequency;

a resonating antenna element and an electronically controllable capacitor means connected to said resonating antenna element for forming with said resonating antenna element a resonant circuit for effectively receiving and passing a selected frequency band of radiant energy signals; and control means responsive to said tuning voltage for generating an electronic control signal and supplying said electronic control signal to said electronically controllable capacitor means for establishing a resonant frequency for said resonant circuit which selects the frequency band of said radiant energy signals to be effectively received and passed from said resonating antenna element.

15. Tuned antenna apparatus according to claim 14, wherein said electronically controllable capacitor means is a varactor means.

16. Tuned antenna apparatus according to claim 15, wherein said resonant circuit includes a tuned resonating FM antenna having first and second grounded parallel rods for resonating at FM frequencies, said varactor means including a varactor diode connected between said first and second rods said electronic control signal being supplied to a selected one of said rods.

17. Tuned antenna apparatus according to claim 15, wherein said resonant circuit includes a resonating AM antenna having a tuned air coil, said varactor means including a varactor diode connected between first and second terminals of said air coil and supplied with said electronic control signal.

18. Tuned antenna apparatus according to claim 14, wherein said resonant circuit includes first and second tunable resonating antennas and said electronically controllable capacitor means includes first and second varactor means for tuning said first and second tunable antennas, respectively, in response to said electronic control signal.

* * * * *